United States Patent
Kang

(10) Patent No.: US 9,194,897 B2
(45) Date of Patent: Nov. 24, 2015

(54) ELECTRONIC WATT-HOUR METER AND ELECTRONIC WATT-HOUR MEASURING METHOD

(75) Inventor: Shin Jae Kang, Gyunggi-do (KR)

(73) Assignees: Samsung Electro-Mechanics Co., Ltd., Suwon-si (KR); Korea Electric Power Corporation, Seoul (KR)

( * ) Notice: Subject to any disclaimer, the term of this patent is extended or adjusted under 35 U.S.C. 154(b) by 828 days.

(21) Appl. No.: 13/336,188

(22) Filed: Dec. 23, 2011

(65) Prior Publication Data

US 2012/0232815 A1 Sep. 13, 2012

(30) Foreign Application Priority Data

Mar. 10, 2011 (KR) .................. 10-2011-0021244

(51) Int. Cl.
*G01R 21/06* (2006.01)
*G01R 21/133* (2006.01)

(52) U.S. Cl.
CPC .................................. *G01R 21/133* (2013.01)

(58) Field of Classification Search
CPC ...... G01R 21/133; G01R 22/00; G01R 35/04; G01R 22/10; G01R 21/06; G01R 21/1331; G01R 22/065; G01R 15/09; G01R 19/25; G01R 21/003; G06J 1/00; Y04S 20/30; Y04S 20/52; Y04S 40/146
USPC ........... 324/142, 107, 115, 116, 141, 74, 120, 324/144, 178, 622, 73.1; 702/60, 61, 64, 702/178, 189, 190, 58, 62, 77, 79, 89; 341/118, 155, 120, 141, 143, 122; 361/659, 663, 664, 668
See application file for complete search history.

(56) References Cited

U.S. PATENT DOCUMENTS 4,355,274 A * 10/1982 Bourbeau ...................... 318/812
4,783,748 A * 11/1988 Swarztrauber et al. ......... 702/62

(Continued)

FOREIGN PATENT DOCUMENTS

| JP | 2005-536722 A | 12/2005 |
|---|---|---|
| JP | 2011-021986 A | 2/2011 |
| WO | WO 2004/017079 A2 | 2/2004 |

OTHER PUBLICATIONS

Negahban et al. (ISSCC 89, WPM 8.3, A DSP-Based Watthour Meter).*

(Continued)

*Primary Examiner* — Sujoy Kundu
*Assistant Examiner* — Lisa Peters
(74) *Attorney, Agent, or Firm* — NSIP Law

(57) ABSTRACT

An electronic watt-hour meter of according to an aspect of the invention includes: a first multiplexer receiving a plurality of detected currents detected in respective polyphase power lines in parallel; a first signal converter converting a signal output from the first multiplexer into a digital signal; a first demultiplexer outputting a serial input from the first signal converter in parallel; a line voltage generator generating a plurality of line voltages from the plurality of detected voltages; a second multiplexer receiving the plurality of line voltages in parallel, to output the received line voltages in series; a second signal converter converting a signal output from the second multiplexer into a digital signal; a second demultiplexer outputting a serial input from the second signal converter in parallel; and an calculating unit calculating a power value from a signal output from the first demultiplexer and a signal output from the second demultiplexer.

10 Claims, 2 Drawing Sheets

(56) References Cited

U.S. PATENT DOCUMENTS

| | | | | |
|---|---|---|---|---|
| 5,289,115 | A * | 2/1994 | Germer et al. | 324/107 |
| 6,026,355 | A * | 2/2000 | Rahman et al. | 702/189 |
| 6,275,021 | B1 * | 8/2001 | Windsheimer | 324/142 |
| 2003/0151415 | A1 * | 8/2003 | Randall et al. | 324/601 |
| 2004/0032357 | A1 * | 2/2004 | White | 341/155 |
| 2008/0186013 | A1 * | 8/2008 | Rzehak et al. | 324/107 |
| 2010/0052962 | A1 * | 3/2010 | Rzehak | 341/143 |

OTHER PUBLICATIONS

Negahban, A DSP-Based Watthour Meter, Feb. 15, 1989, IEEE Explore, ISSCC 89, pp. 92-93 and 303.*

Korean Office Action with English translation issued in Korean Application No. 10-2011-0021244 issued on Apr. 25, 2012.

* cited by examiner

ELECTRONIC WATT-HOUR METER AND ELECTRONIC WATT-HOUR MEASURING METHOD

CROSS-REFERENCE TO RELATED APPLICATIONS

This application claims the priority of Korean Patent Application No. 10-2011-0021244 filed on Mar. 10, 2011, in the Korean Intellectual Property Office, the disclosure of which is incorporated herein by reference.

BACKGROUND OF THE INVENTION

1. Field of the Invention

The present invention relates to an electronic watt-hour meter that may be applied to a general power grid and an electronic watt-hour measuring method.

2. Description of the Related Art

In general, an inductive watt-hour meter has mainly been used as a watt-hour meter. Recently, demand for a watt-hour meter has greatly increased with increased interest in a smart grid.

A smart grid is an intelligent power grid system having increased efficiency by allowing a supplier to interact with a consumer through a combination of information and communications technologies with a process of power generation, power transportation, and power consumption. The power supplier may check a user's predicted power consumption in real time to determine supply and demand requirements of power and the user may check power consumption and power rate in real time to determine his/her power use pattern.

For the smart grid, there is a need for an electronic watt-hour meter that accurately calculates power consumption and converts the calculated power consumption into digital information, an electronic watt-hour measuring method, and a communications technology device transmitting the converted digital information.

The electronic watt-hour meter according to the related art senses three-phase voltage and three-phase current and converts and processes the three-phase voltage and the three-phase current into digital signals, such that it requires at least six signal converters. Therefore, a method of using a multiplexer has been proposed. The method inputs the sensed three-phase voltage (current), to the multiplexer, and the sensed three-phase voltage (current) is in turn input to the signal converters through time distribution. The sensed voltage (current) converted into the digital signals in the signal converters are input to an calculating unit via a demultiplexer and is used to calculate, for example, effective power use, reactive power use and the like.

However, the electronic watt-hour meter using a multiplexer according to the related art is affected by interference between signals having different phases and random noise, which may degrades the accuracy of watt-hour calculation.

SUMMARY OF THE INVENTION

An object of the present invention provides an electronic watt-hour meter capable of greatly reducing a phase interference signal and random noise and an electronic watt-hour measuring method.

According to an exemplary embodiment of the present invention, there is provided an electronic watt-hour meter, including: a first multiplexer receiving a plurality of detected currents detected in respective polyphase power lines in parallel, to output the received detection currents in series; a first signal converter converting a signal output from the first multiplexer into a digital signal; a first demultiplexer outputting a serial input from the first signal converter in parallel; a line voltage generator generating a plurality of line voltages from the plurality of detected voltages detected in the respective polyphase power lines; a second multiplexer receiving the plurality of line voltages in parallel, to output the received line voltages in series; a second signal converter converting a signal output from the second multiplexer into a digital signal; a second demultiplexer outputting a serial input from the second signal converter in parallel; and a calculating unit calculating a power value from a signal output from the first demultiplexer and a signal output from the second demultiplexer.

The electronic watt-hour meter may further include a phase delay unit respectively delaying the plurality of detected currents by a predetermined phase.

The plurality of detected voltages may include a first detected voltage, a second detected voltage, and a third detected voltage detected in the polyphase power lines, and the line voltage generator may include: a first mixer generating a first line voltage that is a differential voltage between the first detected voltage and the second detected voltage; a second mixer generating a second line voltage that is a differential voltage between the second detected voltage and the third detected voltage; and a third mixer generating a third line voltage that is a differential voltage between the third detected voltage and the first detected voltage.

The plurality of detected currents may include the first detected current, the second detected current, and the third detected current detected in the polyphase power lines, and the phase delay unit may include: a first phase delay unit delaying the first detected current by a predetermined phase; a second phase delay unit delaying the second detected current by a predetermined phase; and a third phase delay unit delaying the third detected current by a predetermined phase.

The second multiplexer may further receive an additional signal that is at least one of a leakage detected current detected from current flowing in a neural line of the polyphase power lines and a temperature detection signal, and the second demultiplexer may further include an output terminal outputting the additional signal converted into the digital signal in the second signal converter.

According to another exemplary embodiment of the present invention, there is provided an electronic watt-hour measuring method, including: receiving a plurality of detected currents detected in respective polyphase power lines in parallel, to output the received detection currents in series; converting the output detected currents into first digital signals; receiving the first digital signals in series to output the received first digital signals in parallel; respectively generating a plurality of line voltages from the plurality of detected voltages detected in the respective polyphase power lines; receiving the plurality of line voltages in parallel, to output the plurality of received line voltages in series; converting the output line voltages into second digital signals; receiving the second digital signals in series to output the received second digital signals in parallel; and calculating a power value from the output first digital signals and second digital signals.

The electronic watt-hour measuring method may further include respectively delaying the plurality of detected currents by a predetermined phase.

The plurality of detected voltages may include a first detected voltage, a second detected voltage, and a third detected voltage detected in the polyphase power lines, and the generating of the plurality of line voltages may include: generating a first line voltage that is a differential voltage between the first detected voltage and the second detected voltage; generating a second line voltage that is a differential voltage between the second detected voltage and the third detected voltage; and generating a third line voltage that is a differential voltage between the third detected voltage and the first detected voltage.

The plurality of detected currents may include the first detected current, the second detected current, and the third detected current detected in the polyphase power lines, and the delaying of the plurality of detected currents may delay the first to third detected currents, respectively, by a predetermined phase.

The outputting of the line voltages in series may further include receiving an additional signal that is at least one of a leakage detected current detected from current flowing in a neural line of the polyphase power lines and a temperature detection signal, and the outputting of the second digital signals in parallel may further include outputting the additional signal converted into the digital signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
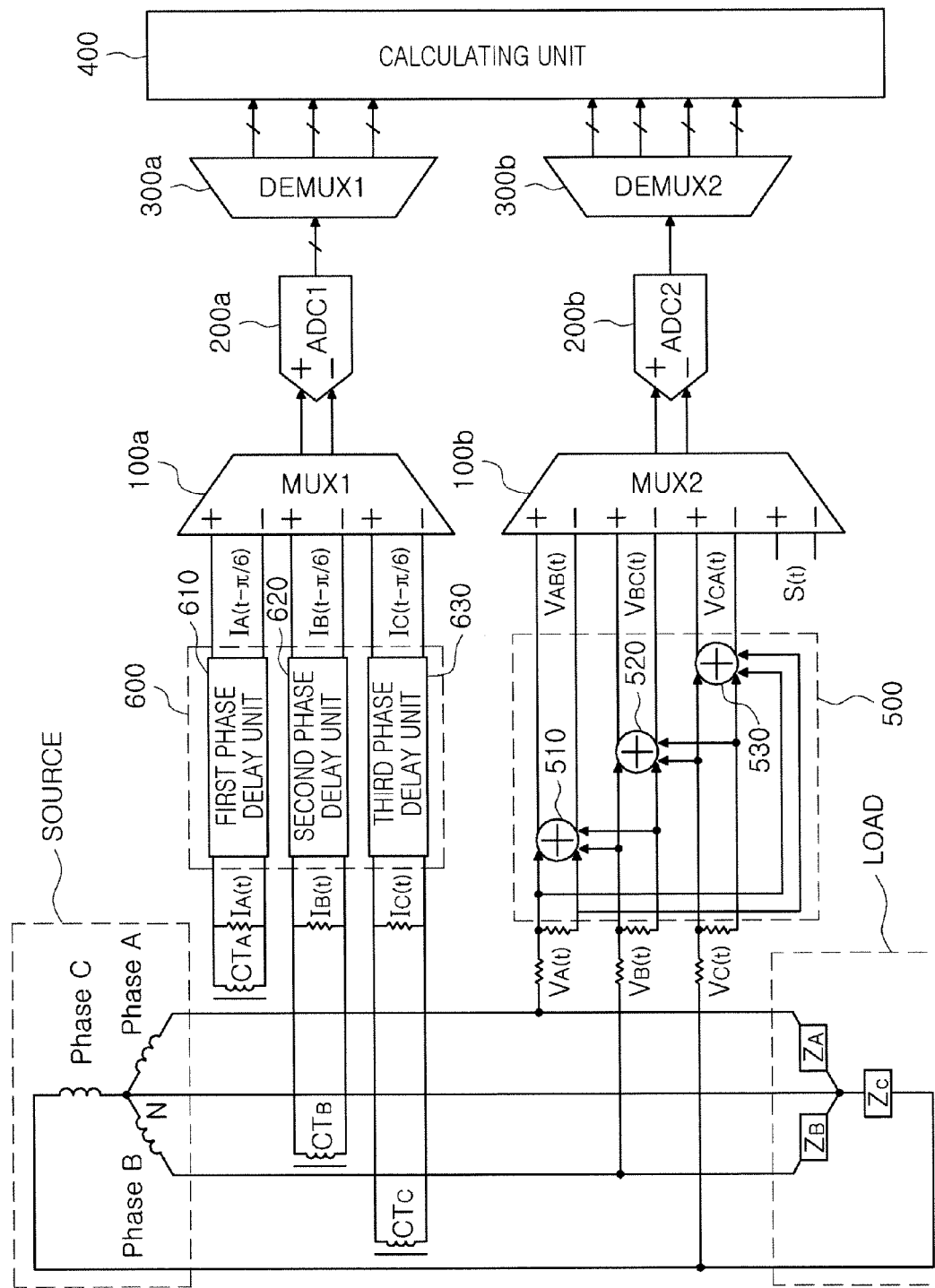
FIG. 1 is a configuration diagram of an electronic watt-hour meter according to an exemplary embodiment of the present invention.

Hereinafter, exemplary embodiments of the present invention will be described with reference to the accompanying drawings.

The present invention is not limited to the described exemplary embodiments and the exemplary embodiments of the present invention are used to help in an understanding of the technical ideas of the present invention. Components having like configurations and functions in the accompanying drawings of the present invention will be denoted by like reference numerals.

FIG. 1 is a configuration diagram of an electronic watt-hour meter according to an exemplary embodiment of the present invention.

Referring to FIG. 1, an electronic watt-hour meter according to an exemplary embodiment of the present invention may include a first multiplexer 100a, a first signal converter 200a, a first demultiplexer 300a and a phase delay unit 600 at a three-phase current side and may include a line voltage generator 500, a second multiplexer 100b, a second signal converter 200b, a second demultiplexer 300b, and an calculating unit 400 at a three-phase voltage side.

The first multiplexer 100a may receive, as an input, a plurality of detected currents of which the phase is delayed, which are detected from each phase of three-phase power lines and output the phase-delayed detected current corresponding to any one of three phases to the first signal converter 200a. In this case, the current detection from the power lines of each phase of the three-phase power lines may be performed by a current transformer (CT) in order to attenuate a detected current value to one-several thousandth of a real value of the corresponding power line. That is, a first detected current IA(t), a second detected current IB(t), and a third detected current IC(t) may each be detected by a first current transformer CTA at a power line of a first phase (Phase A) of the three-phase power lines, a second current transformer CTB at a power line of a second phase (Phase B) thereof, and a third current transformer (CTC) at a power line of a third phase (Phase C) thereof.

In this case, the first multiplexer 100a may receive the plurality of detected currents detected from each phase in parallel and sequentially output the plurality of detected currents or output the detected currents according to a control of a controller (not shown).

The first signal converter 200a may convert the detected currents received from the first multiplexer 100a into the digital signals. In this case, the first signal converter 200a may be configured to include an analog to digital converter (ADC) and a filter. The analog to digital converter may have a resolution of 15 bits or more.

The first demultiplexer 300a may output the detected current converted into the digital output from the first signal converter 200a to the calculating unit 400. The detected current converted into the digital input to the first demultiplexer 300a is output through any one of a plurality of output terminals of the first demultiplexer 300a. That is, the first demultiplexer 300a may receive the detected current converted into the digital in series and output the detected current in parallel.

The phase delay unit 600 may delay each phase of the plurality of detected currents input to the first multiplexer 100a by as much as a predetermined magnitude. In this case, the phase delay unit 600 may include a first phase delay unit 610, a second phase delay unit 620, and a third phase delay unit 630 that correspond to each phase of three-phase power. In addition, the predetermined magnitude delayed in the phase delay unit 600 may be $\pi/6$.

The line voltage generator 500 may generate a line voltage from a plurality of detected voltages detected in the three-phase power lines. In this case, the voltage of each phase of the three-phase power lines may be detected by dividing the voltage using a plurality of resistors. That is, a first detected voltage VA(t), a second detected voltage VB(t), and a third detected voltage VC(t) may each be detected in the power line of the first phase (Phase A) of the three-phase power lines. In addition, the line voltage generator 500 may include a first mixer 510, a second mixer 520, and a third mixer 530. The first mixer 510 may generate a first line voltage from a differential voltage between the first detected voltage and the second detected voltage. The second mixer 520 may generate a second line voltage from a differential voltage between the second detected voltage and the third detected voltage. Similarly, the third mixer 530 may generate a third line voltage from a differential voltage between the third detected voltage and the first detected voltage.

The second multiplexer 100b may receive the plurality of line voltages generated from the line voltage generator 500 in parallel and serially output the plurality of received line voltages to the second signal converter 200b in sequence or according to the control of the controller (not shown). In this case, the second multiplexer 100b may output the plurality of line voltages in sequence or according to the control of the controller (not shown). In addition, the second multiplexer 100b may further receive an additional signal that is at least one of a leakage detected current that has been detected from current flowing in a neutral line of the polyphase power lines, and a temperature detection signal; and may output the input additional signal to the second signal converter 200b.

The second signal converter 200b may convert the line voltage input from the second multiplexer 100b into the digital signals. In this case, the second signal converter 200b may be configured to include the analog to digital converter (ADC) and the filter. The analog to digital converter may have a resolution of 15 bits or more.

The second demultiplexer 300b may output the line voltage converted into the digital output from the second signal converter 200b to the calculating unit 400. That is, the second demultiplexer 300b may output the line voltage converted into the digital through any one of the plurality of output terminals.

The calculating unit 400 may receive the detected current converted into the digital output from the first demultiplexer 300a and the line voltage converted into the digital output from the second demultiplexer 300b to calculate a necessary power value of, for example, effective power, reactive power, or the like.

Figure 2:
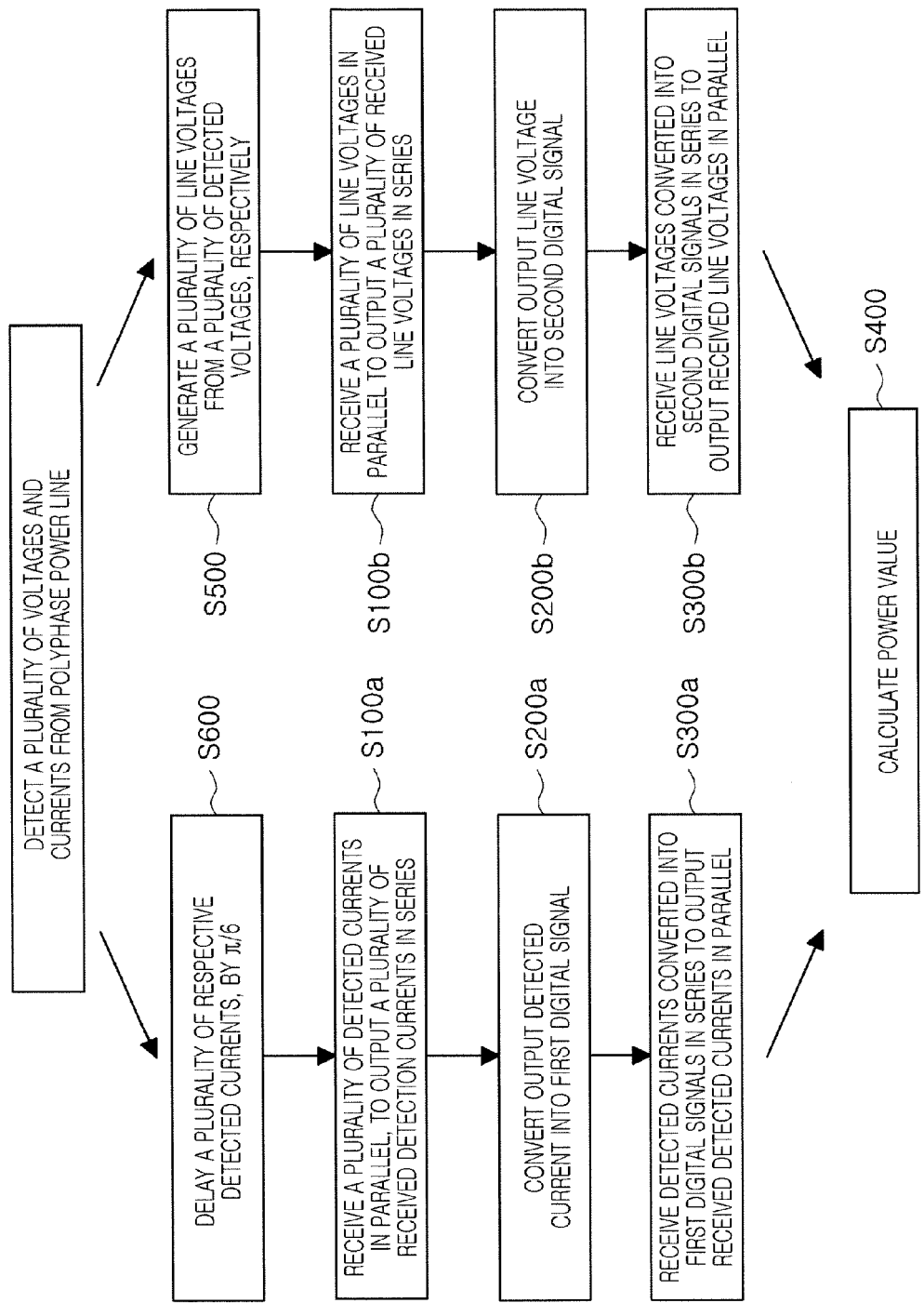
FIG. 2 is a flow chart of an electronic watt-hour measuring method according to the exemplary embodiment of the present invention.

FIG. 2 is a flow chart of an electronic watt-hour measuring method according to the exemplary embodiment of the present invention.

Referring to FIG. 2, the electronic watt-hour measuring method according to the exemplary embodiment of the present invention may include delaying each of the plurality of detected currents by π/6 (S600), receiving the plurality of detected currents in parallel, to output the plurality of received detection currents in series (S100a), converting the output detected currents into first digital signals (S200a), receiving the detected currents converted into the first digital signals in series to output the received detection currents in parallel (S300a), generating the plurality of line voltages from the plurality of detected voltages, respectively, (S500), receiving the plurality of line voltages in parallel, to output the plurality of received line voltages in series (S100b), converting the output line voltages into second digital signals (S200b), receiving the line voltages converted into the second digital signals in series to output the received line voltages in parallel (S300b), and calculating the power value (S400), thereby electronically measuring the necessary watt-hours.

Hereinafter, the action and effect of the exemplary embodiment of the present invention will be described in detail with reference to the accompanying drawings.

Referring to FIG. 1, an electronic watt-hour meter according to an exemplary embodiment of the present invention may include a first multiplexer 100a, a first signal converter 200a, a first demultiplexer 300a and a phase delay unit 600 at a three-phase current side and may include a line voltage generator 500, a second multiplexer 100b, a second signal converter 200b, a second demultiplexer 300b, and an calculating unit 400 at a three-phase voltage side.

The electronic watt-hour meter according to the exemplary embodiment of the present invention requires a current value and a voltage value detected in the three-phase power lines and converted into the digital in order to calculate predetermined power in the calculating unit 400. Hereinafter, in order to elucidate the exemplary embodiment of the present invention, a configuration of detecting and processing voltage in the three-phase power lines will be first described and then, a configuration of detecting and processing current will be described.

Phase voltages VA(t), VB(t), and VC(t) of each phase may be detected by a plurality of resistors connected to the power line of each of the Phase A, Phase B, and Phase C of the three-phase power lines. The line voltage generator 500 may generate line voltages VAB(t), VBC(t), and VCA(t) from the plurality of detected voltages detected from each phase. The plurality of line voltages may be generated in the first mixer 510, the second mixer 520, and the third mixer 530 of the line voltage generator 500, respectively. That is, the first mixer 510 generates the first line voltage VAB(t) by the voltage differential between the first detected voltage VA(t) detected in the power line of the first phase (Phase A) and the second detected voltage VB(t) detected in the power line of the second phase (Phase B). Similarly, the second mixer 520 and the third mixer 530 generate the second line voltage VBC(t) and the third line voltage VCA(t). The generation of the line voltage in each mixer may be represented by the following Equation 1.

$$V_{AB}(t)=V_A(t)-V_B(t)$$

$$V_{BC}(t)=V_B(t)-V_C(t)$$

$$V_{CA}(t)=V_C(t)-V_A(t) \quad \text{[Equation 1]}$$

In the related art, the power is calculated using the voltage detected in the power lines of each phase rather than using the line voltage. As such, when the voltage is detected in the power lines, the phase interference signal components and the random noise signals may be caused. Therefore, it may be difficult to calculate the accurate power due to the phase interference signal components and the random noise signals. This may be represented by the following Equation 2.

$$V_A(t)=V_{A0}(t)+\Delta n_{phase-B}+\Delta n_{phase-C}+\Delta n_{random}$$

$$V_B(t)=V_{B0}(t)+\Delta n_{phase-C}+\Delta n_{phase-A}+\Delta n_{random}$$

$$V_C(t)=V_{C0}(t)+\Delta n_{phase-A}+\Delta n_{phase-B}+\Delta n_{random} \quad \text{[Equation 2]}$$

In Equation 2, Δn phase-A, Δn phase-B, and Δn phase-C imply the phase interference signal components, Δn random is random noise component, $V_{Ao}(t)$, $V_{Bo}(t)$, and $V_{CO}(t)$ imply the voltage in the power line of each phase.

On the other hand, the electronic watt-hour meter according to the exemplary embodiment of the present invention may generate the line voltage from the line voltage generator 500. Referring to the above Equations 1 and 2, each line voltage may be generated by the differential voltage of the detected voltage and as a result, it may be appreciated that a portion of the random noise component and the phase interference signal component is cancelled. The line voltage with the reduced influence of the phase interference signal component and the random noise signal is used to calculate the power, thereby greatly increasing the accuracy of the power calculation as compared to the related art.

The second multiplexer 100b may receive, as an input, the plurality of line voltages VAB(t), VBC(t), and VCA(t) generated from the line voltage generator 500 and selectively output any one of the line voltages to the second signal converter 200b. In this case, the second multiplexer 100b may output the plurality of detected line voltages in sequence or output the line voltages in a different order according to the control of the controller (not shown).

The second signal converter 200b may convert the line voltages input from the second multiplexer 100b into the digital signals. The second signal converter 200b may be configured to include the analog to digital converter (ADC) and the filter. That is, the analog signal generated from the line voltage generator 500, i.e., each line voltage is converted into a digital signal in the analog to digital converter. The converted digital signals are output to the second demultiplexer 300b through the filter in order to remove the noise and obtain only the necessary frequency band signal.

The second demultiplexer 300b may output the line voltage converted into the digital output from the second signal converter 200b to the calculating unit 400. That is, when the line voltages of each phase are serially or selectively input from the second signal converter 200b, the second demultiplexer 300b outputs the line voltages converted into the digital signals to the plurality of output terminals connected to the calculating unit 400 in parallel.

The electronic watt-hour meter according to the exemplary embodiment of the present invention may process the current detected in the three-phase power lines by using the first multiplexer 100a, the first signal converter 200a, and the first demultiplexer 300a while detecting and processing the voltages of each phase and the contents thereof will be described.

The phase delay unit 600 may delay each phase of the plurality of detected currents input to the first multiplexer 100a by a predetermined magnitude.

The current detection from the power lines of respective phases of the three-phase power lines may be performed by the current transformer (CT) in order to attenuate the detected current value to one-several thousandth of a real value of the corresponding power line. That is, the first detected current IA(t), the second detected current IB(t), and the third detected current IC(t) may each be detected by the first current transformer CTA in the power line of the first phase (Phase A) of the three-phase power lines, the second current transformer CTB in the power line of the second phase (Phase B) thereof, and the third current transformer (CTC) in the power line of the third phase (Phase C) thereof.

In this case, the phase delay unit 600 may include a first phase delay unit 610, a second phase delay unit 620, and a third phase delay unit 630 that correspond to each phase of three-phase power. The predetermined magnitude delayed in the phase delay unit 600 may be $\pi/6$, such that each line voltage has the phase difference with the detected currents by as much as $\pi/6$ when each line voltage is generated from the line voltage generator 500. Therefore, detected current IA(t), IB(t), and IC(t) detected in the three-phase power lines are respectively delayed by $\pi/6$ in the first phase delay unit 610, the second phase delay unit 620, and the third phase delay unit 630 that are included in the phase delay unit 600 to match the phases of each line voltage input to the second multiplexer 100b with the phases of the detected currents input to the first multiplexer 100a.

That is, the first detected current IA(t) is changed into IA (t−$\pi/6$) by the first phase delay unit 610, the second detected current is changed into IB (t−$\pi/6$) by the second phase delay unit 620, and the third detected current is changed into IC (t−$\pi/6$) by the third phase delay unit 630, which are in turn input to the first multiplexer 100a.

The phase-delayed detection currents may be converted into the digital signals by the first multiplexer 100a, the first signal converter 200a, and the first demultiplexer 300a and are then input to the calculating unit 400. Each component is similar to the second multiplexer 100b, the second signal converter 200b, and the second demultiplexer 300b and the description thereof will be omitted.

The calculating unit 400 may receive the detected current converted into the digital output from the first demultiplexer 300a and the line voltage converted into the digital output from the second demultiplexer 300b to calculate a necessary power value of, for example, effective power, reactive power, or the like.

FIG. 2 is a flow chart of an electronic watt-hour measuring method according to the exemplary embodiment of the present invention.

Referring to FIG. 2, the delaying of the plurality of detected currents by as much as $\pi/6$ (S600) may be performed to detect the currents according to each phase in the three-phase power lines and delay the phases of the detected currents by as much as $\pi/6$.

The receiving of the plurality of detected currents in parallel, to output the detected currents in series (S100a) may be performed to receive the plurality of detected currents detected in the respective polyphase power lines in parallel, to output the plurality of detected currents in series. In operation S100a, the multiplexer may be used.

The converting of the output detected current into the first digital signal (S200a) may be performed to convert the output detected current into the first digital signal. In this case, the converting of the detected current into the digital signal may be performed in the analog to digital converter (ADC). The analog to digital converter may have a resolution of 15 bits or more.

The receiving of the detected currents converted into the first digital signals in series to output the received detection currents in parallel (S300a) may be performed to receive the detected currents converted into the first digital signals in series to output the received detection currents in parallel. The operation S300a may be performed through the demultiplexer.

The generating of the plurality of line voltages from the plurality of detected voltages (S500) may generate the plurality of line voltages from the plurality of detected voltages, respectively, detected in the respective polyphase power lines.

The receiving of the plurality of line voltages in parallel, to output the plurality of received line voltages in series (S100b) may receive the plurality of generated line voltages in parallel, to output the received line voltages in series. The operation S100b may be performed through the multiplexer.

The converting of the output line voltage into the second digital signal (S200b) may be performed to output the line voltage converted into the second digital signal. In this case, the converting of the line voltage into the digital signal may be performed in the analog to digital converter (ADC). The analog to digital converter may have a resolution of 15 bits or more.

The receiving of the line voltages converted into the second digital signals in series, to output the received detection currents in parallel (S300b) may include receiving the line voltages converted into the second digital signals in series to output the received detection currents in parallel. The operation S300b may be performed through the demultiplexer.

The calculating of the power value (S400) may include receiving the first digital signal and the second digital signal to calculate the necessary power value of, for example, effective power use, reactive power use and the like.

As set forth above, according to the exemplary embodiment of the present invention, the accurate watt-hour may be electronically measured, thereby greatly reducing the influence of the phase interference signal and the random noise.

While the present invention has been shown and described in connection with the exemplary embodiments, it will be apparent to those skilled in the art that modifications and variations can be made without departing from the spirit and scope of the invention as defined by the appended claims.

What is claimed is:

1. An electronic watt-hour meter, comprising:
   a first multiplexer receiving a plurality of detected currents detected in respective polyphase power lines in parallel, to output the received detection currents in series;
   a first signal converter converting a signal output from the first multiplexer into a digital signal;
   a first demultiplexer outputting a serial input from the first signal converter in parallel;
   a line voltage generator generating a plurality of line voltages from the plurality of detected voltages detected in the respective polyphase power lines, the plurality of line voltages including a reduced phase interference signal component and a reduced random noise signal component;

a second multiplexer receiving the plurality of line voltages in parallel, to output the received line voltages in series;

a second signal converter converting a signal output from the second multiplexer into a digital signal;

a second demultiplexer outputting a serial input from the second signal converter in parallel; and a calculating unit calculating a power value from a signal output from the first demultiplexer and a signal output from the second demultiplexer.

2. The electronic watt-hour meter of claim 1, further comprising a phase delay unit respectively delaying the plurality of detected currents by a predetermined phase.

3. The electronic watt-hour meter of claim 1, wherein the plurality of detected voltages include a first detected voltage, a second detected voltage, and a third detected voltage detected in the polyphase power lines, and the line voltage generator includes:

a first mixer generating a first line voltage that is a differential voltage between the first detected voltage and the second detected voltage;

a second mixer generating a second line voltage that is a differential voltage between the second detected voltage and the third detected voltage; and a third mixer generating a third line voltage that is a differential voltage between the third detected voltage and the first detected voltage.

4. The electronic watt-hour meter of claim 2, wherein the plurality of detected currents include the first detected current, the second detected current, and the third detected current detected in the polyphase power lines, and the phase delay unit includes:

a first phase delay unit delaying the first detected current by a predetermined phase;

a second phase delay unit delaying the second detected current by a predetermined phase; and a third phase delay unit delaying the third detected current by a predetermined phase.

5. The electronic watt-hour meter of claim 1, wherein the second multiplexer further receives an additional signal that is at least one of a leakage detected current detected from current flowing in a neural line of the polyphase power lines and a temperature detection signal, and the second demultiplexer further includes an output terminal outputting the additional signal converted into the digital signal in the second signal converter.

6. An electronic watt-hour measuring method performed by an electronic watt-hour meter, comprising:

receiving a plurality of detected currents detected in respective polyphase power lines in parallel, to output the received detection currents in series;

converting the output detected currents into first digital signals;

receiving the first digital signals in series to output the received first digital signals in parallel;

respectively generating a plurality of line voltages from the plurality of detected voltages detected in the respective polyphase power lines, the plurality of line voltages including a reduced phase interference signal component and a reduced random noise signal component;

receiving the plurality of line voltages in parallel, to output the plurality of received line voltages in series;

converting the output line voltages into second digital signals;

receiving the second digital signals in series to output the received second digital signals in parallel; and calculating a power value from the output first digital signals and second digital signals.

7. The electronic watt-hour measuring method of claim 6, further comprising respectively delaying the plurality of detected currents by a predetermined phase.

8. The electronic watt-hour measuring method of claim 6, wherein the plurality of detected voltages include a first detected voltage, a second detected voltage, and a third detected voltage detected in the polyphase power lines, and the generating of the plurality of line voltages includes:

generating a first line voltage that is a differential voltage between the first detected voltage and the second detected voltage;

generating a second line voltage that is a differential voltage between the second detected voltage and the third detected voltage; and generating a third line voltage that is a differential voltage between the third detected voltage and the first detected voltage.

9. The electronic watt-hour measuring method of claim 7, wherein the plurality of detected currents include the first detected current, the second detected current, and the third detected current detected in the polyphase power lines, and the delaying of the plurality of detected currents delays the first to third detected currents, respectively, by a predetermined phase.

10. The electronic watt-hour measuring method of claim 6, wherein the outputting of the line voltages in series further includes receiving an additional signal that is at least one of leakage detected currents detected from current flowing in a neural line of the polyphase power lines and a temperature detection signal, and the outputting of the second digital signals in parallel further includes outputting the additional signal converted into the digital signal.

* * * * *